United States Patent [19]
Probst

[11] Patent Number: 4,833,569
[45] Date of Patent: May 23, 1989

[54] PLUG-IN POWER SUPPLY MODULE

[75] Inventor: Harald Probst, Munich, Fed. Rep. of Germany

[73] Assignee: Siemens Aktiengesellschaft, Berlin and Munich, Fed. Rep. of Germany

[21] Appl. No.: 74,610

[22] Filed: Jul. 17, 1987

[30] Foreign Application Priority Data

Aug. 25, 1986 [DE] Fed. Rep. of Germany ....... 8622759

[51] Int. Cl.⁴ .............................................. H05K 7/20
[52] U.S. Cl. .................................... 361/388; 361/383; 361/386
[58] Field of Search ....... 165/80.3; 361/381, 383–384, 361/386–389, 395, 399, 412; 363/141

[56] References Cited

U.S. PATENT DOCUMENTS

| 4,298,904 | 11/1981 | Koenig | 165/80.3 |
| 4,557,225 | 12/1985 | Sagues et al. | 361/383 |
| 4,574,330 | 3/1986 | Cohen et al. | 361/383 |

Primary Examiner—A. D. Pellinen
Assistant Examiner—Gregory D. Thompson
Attorney, Agent, or Firm—Mark H. Jay

[57] ABSTRACT

Heat-generating components of a power supply circuit are mounted to a heat-conducting substrate. The heat-conducting substrate is electrically connected to a circuit board through contacts. The heat-conducting substrate is mounted to a heat sink which is in turn mounted to a front panel. Heat generated by the heat-generating components is carried through the heat-conducting substrate to the heat sink and to the front panel, where it is dissipated.

4 Claims, 1 Drawing Sheet

PLUG-IN POWER SUPPLY MODULE

BACKGROUND OF THE INVENTION

The invention relates to power supplies for plug-in circuit boards.

It is known to locate the power supply for plug-in circuit boards in a dedicated unit which, like the circuit boards to be supplied, is itself plugged into a rack. Electrical connections for this dedicated power supply are established through the back panel wiring. Because this collects heat-generating components, the danger of local overheating (which can destroy the rack) is presented.

One object of the invention is to provide a power supply for plug-in circuit boards which is not as likely to be destroyed by overheating.

Another object is, in general, to improve on known power supplies of this type.

SUMMARY OF THE INVENTION

In accordance with the invention, the heat-generating components of a power supply circuit are supported by a heat-conducting substrate, to which a heat sink is thermally connected. A front panel is thermally connected to the heat sink, and a circuit board is supported by the front panel and electrically connected to the power supply circuit.

The heat-generating components, heat-conducting substrate and heat sink form a power supply module which is connectable to the circuit board just like an electrical component. Electrical components which do not generate much heat may be mounted directly to the circuit board.

This construction consumes a minimum amount of mounting space on the circuit board. The substrate (which may be for example of ceramic or epoxy fiberglass) establishes good thermal contact with the heat sink (and perhaps with the front panel also). This permits a maximum amount of heat dissipation and corresponding reduction in thermal stress on the power supply circuit.

BRIEF DESCRIPTION OF THE DRAWINGS

Exemplary and non-limiting preferred embodiments of the invention are shown in the drawings, in which.

DETAILED DESCRIPTION OF PREFERRED EMBODIMENTS

Figure 1:
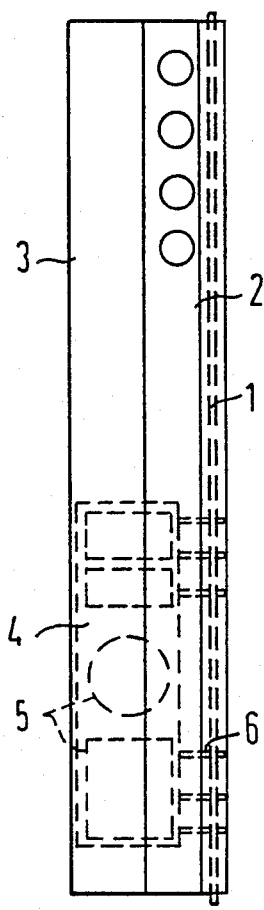
FIG. 1 is a front view of a preferred embodiment of the invention.
Figure 2:
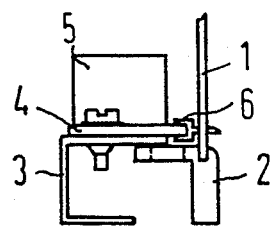
FIG. 2 is a side view of the preferred embodiment of the invention.

A power supply circuit (otherwise not shown) includes heat-generating components 5 (such as transistors inductors, etc.). The heat-generating components 5 are mounted to a heat-conducting substrate 4 (of e.g. ceramic or epoxy fiberglass) to form a power module. The rest of the power supply circuit (not shown) is mounted to a circuit board 1, which is electrically connected to the heat-conducting substrate 4 through contacts 6.

The heat-conducting substrate 4 is connected to a heat sink 3, as by screws or adhesive (a screw connection is shown), and the heat sink 3 is fastened to the front panel 2. The heat sink 3 and front panel 2 dissipate the heat generated by the power components 5. The heat sink 3 is bent at right angles to form a U in cross-section. This reduces the profile of the heat sink 3 and reduces the mounting space required.

Those skilled in the art will understand that changes can be made in the preferred embodiments here described, and that these embodiments can be used for other purposes. Such changes and uses are within the scope of the invention, which is limited only by the claims which follow.

What is claimed is:

1. A plug-in power supply module, comprising:
   a power supply circuit including heat-generating components;
   a heat-conducting substrate supporting the heat-generating components;
   a heat sink which is thermally connected to the heat-conducting substrate;
   a front panel which is thermally connected to the heat sink; and
   a circuit board which is fixed to the front panel and which is electrically connected to the heat-conducting substrate.

2. The module of claim 1, wherein the heat sink is bent into right angles and has a U-shaped cross-section.

3. The module of claim 1, wherein the front panel is thermally conductive and serves as another heat sink.

4. The module of claim 1, wherein the heat sink mechanically supports the power supply circuit.